United States Patent
Lee et al.

(10) Patent No.: US 7,368,181 B2
(45) Date of Patent: May 6, 2008

(54) ORGANIC ELECTROLUMINESCENT ELEMENTS INCLUDING TRIAZINE DERIVATIVE COMPOUNDS

(75) Inventors: Hyoyoung Lee, Daejeon (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 186 days.

(21) Appl. No.: 11/183,207

(22) Filed: Jul. 15, 2005

(65) Prior Publication Data

US 2006/0127697 A1    Jun. 15, 2006

(30) Foreign Application Priority Data

Dec. 15, 2004   (KR) .................. 10-2004-0106499
Jan. 19, 2005   (KR) .................. 10-2005-0004972

(51) Int. Cl.
*H01L 51/50*  (2006.01)
*H05B 33/12*  (2006.01)

(52) U.S. Cl. ............... 428/690; 428/917; 313/504; 313/506; 313/512

(58) Field of Classification Search ............ 428/690; 429/917; 313/504, 506, 512; 257/40
See application file for complete search history.

(56) References Cited

U.S. PATENT DOCUMENTS 6,737,177 B2 *   5/2004   Aziz et al. ............... 428/690
2006/0076553 A1 *  4/2006   Lee et al. ................. 257/40

FOREIGN PATENT DOCUMENTS

JP   2001 247498   9/2001
JP   2002 359086   12/2002
JP   2004-103576   * 4/2004

OTHER PUBLICATIONS

'Synthesis, Characterization, and Electron-Transport Property of Perfluorinated Phenylene Dendrimers' Sakamoto et al., J. Am. Chem. Soc. 2000, 122, pp. 1832-1833.
'Perfluorinated Oligo(p-Phenylene)s: Efficient n-Type Semiconductors for Organic Light-Emitting Diodes' Heidenhain et al., 2000 American Chemical Society, J. Am. Chem. Soc.

* cited by examiner

Primary Examiner—Terrel Morris
Assistant Examiner—Camie Thompson
(74) Attorney, Agent, or Firm—Ladas & Parry LLP

(57) ABSTRACT

An organic electroluminescent element including an organic compound layer which is composed of a C—F compound (PFPT) having a triazine group is provided. The organic electroluminescent element includes: two electrodes; and at least one organic compound layer formed between the two electrodes, in which the organic compound layer is doped with a triazine derivative compound represented by the following Formula:

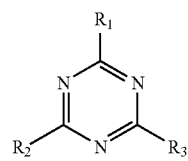

where each of $R_1$, $R_2$ and $R_3$ is a perfluorophenylene derivative.

9 Claims, 6 Drawing Sheets

ORGANIC ELECTROLUMINESCENT ELEMENTS INCLUDING TRIAZINE DERIVATIVE COMPOUNDS

CROSS-REFERENCE TO RELATED PATENT APPLICATION

This application claims the benefit of Korean Patent Application Nos. 10-2004-0106499, filed on Dec. 15, 2004, and 10-2005-0004972, filed on Jan. 19, 2005, in the Korean Intellectual Property Office, the disclosures of which are incorporated herein in their entirety by reference.

BACKGROUND OF THE INVENTION

1. Field of the Invention

The present invention relates to organic electroluminescent elements, and more particularly, to organic electroluminescent elements comprising functional organic compound layers including triazine derivative compounds.

2. Description of the Related Art

An organic electroluminescent element has a layered structure in which a hole injection layer (HIL) and an electron injection layer (EIL) are formed on a substrate, and an emitting layer (EML) and a carrier transport layer, i.e. an electron transport layer (ETL) or a hole transport layer (HTL) are formed between the HIL and the EIL. Generally, the HIL, the HTL, the ETL and the EIL in the layered structure are organic thin layers.

Compounds having C—H bonds, such as $C_6H_6$ (benzene ring), have been generally used as organic materials for the functional organic thin layer. However, since C—H bonds have a low bond energy, they are easily broken and the material containing them is deteriorated when irradiated with ultra violet rays or a high voltage is applied thereto, thereby causing a reduction in the lifespan of the organic electroluminescent element.

Recently, attempts have been made to extend lifespan of an organic electroluminescent element by forming an organic electroluminescent element using a functional organic thin layer composed of a perfluorophenylene derivative compound which has fluoro substituents with a C—F bond instead of the C—H bond (for example, Japanese Laid-Open Patent Publication Nos. 2001-247498 and 2002-359086). However, despite these efforts, due to a difficulty in substituting fluorine, organic electroluminescent materials and elements using the perfluorophenylene derivative compound are not easily developed.

SUMMARY OF THE INVENTION

The present invention provides an organic electroluminescent element having increased luminous efficiency and lifespan by using an organic compound having a strong C—F bond.

According to an aspect of the present invention, there is provided an organic electroluminescent element including: two electrodes; and at least one organic compound layer formed between the two electrodes, in which the organic compound layer is composed of an organic compound doped with a triazine derivative compound represented by the following Formula:

where each of $R_1$, $R_2$ and $R_3$ is a perfluorophenylene derivative.

The concentration of the triazine derivative compound doped in the organic compound layer is 0.001 to 10% by weight.

A hole injection layer (HIL), a hole transport layer (HTL), an emitting layer (EML), an electron transport layer (ETL) and an electron injection layer (EIL) may be sequentially deposited between the two electrodes and the organic compound layer may be at least one layer selected from the group consisting of the HIL, the HTL, the EML, the ETL and the EIL.

The organic electroluminescent element may further include a protecting layer for protecting the two electrodes and the organic compound layer from external moisture and oxygen.

According to another aspect of the present invention, there is provided an organic electroluminescent element including: two electrodes; and a HIL, a HTL, an EML, an ETL and an EIL sequentially formed between the two electrodes. At least one layer selected from the group consisting of the HIL, the HTL, the EML, the ETL and the EIL are composed of a triazine derivative compound represented by the following Formula:

where each of $R_1$, $R_2$ and $R_3$ is the same as defined above.

According to another aspect of the present invention, there is provided an organic electroluminescent element including: two electrodes, a layered element including a HIL, a HTL, an EML, an ETL and an EIL sequentially formed between the two electrodes; and a protecting layer for protecting the layered element from external moisture and oxygen. The protecting layer is composed of a triazine derivative compound represented by the following Formula:

where each of $R_1$, $R_2$ and $R_3$ is the same as defined above.

The organic electroluminescent element according to the present invention can present an extended lifespan and an increased luminous efficiency.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
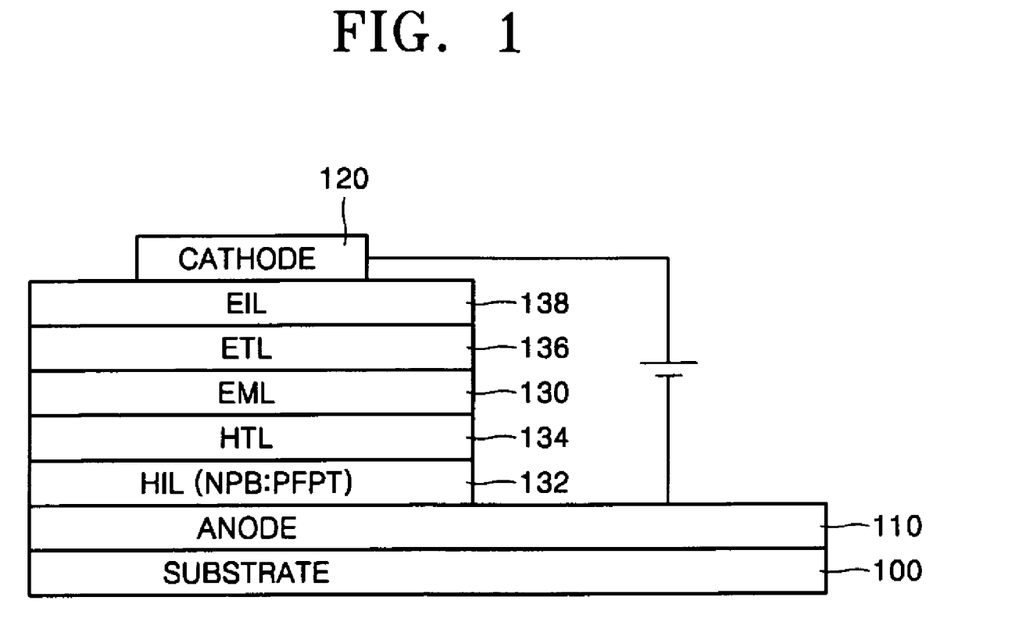
FIG. 1 is a schematic diagram of an organic electroluminescent element according to an embodiment of the present invention.

FIG. 1 is a schematic diagram of an organic electroluminescent element according to an embodiment of the present invention.

Referring to FIG. 1, an anode 110 and a cathode 120 face each other by a predetermined distance on a substrate 100. An emitting layer (EML) 130 which emits light when applying voltage or current to the anode 110 and the cathode 120 is interposed between the anode 110 and the cathode 120.

A hole injection layer (HIL) 132 and a hole transport layer (HTL) 134 are sequentially formed between the anode 110 and the EML 130. An electron transport layer (ETL) 136 and an electron injection layer (EIL) 138 are sequentially formed between the EML 130 and the cathode 120. The HIL 132, the HTL 134, the ETL 136 and the EIL 138 are composed of organic compounds. In particular, at least one organic compound layer selected from the group consisting of the HIL 132, the HTL 134, the ETL 136 and the EIL 138 is doped with a triazine derivative compound represented by Formula (1):

where each of $R_1$, $R_2$ and $R_3$ is a perfluorophenylene derivative.

In FIG. 1, the HIL 132 is exemplarily doped with a perfluorophenylene triazine compound (PFPT) represented by Formula (1).

Preferably, the concentration of PFPT in the organic compound layer is about 0.001 to 10% by weight.

Each of $R_1$, $R_2$ and $R_3$ may be represented by Formula (2), Formula (3) or Formula (4):

where n is an integer from 0 to 20.

In FIG. 1, the substrate 100 may be composed of glass or plastics. The anode 110 may be composed of a transparent conductive layer, for example, indium tin oxide (ITO) or ZnO and the cathode layer 120 may be composed of a metal, for example, Al.

The HIL 132 and the HTL 134 may be composed of NPB (N,N'-di(naphthalen-1-yl)-N,N'-diphenyl-benzidine) or TPD (N,N'-diphenyl-N,N'-bis(3-methylphenyl)-1,1'-bi-phenyl-4,4'-diamine). For example, as illustrated in FIG. 1, the HIL 132 may be composed of NPB doped with PFPT and the HTL 134 may be composed of NPB.

The EML 130 is composed of a material selected according to color to be emitted. For example, the EML 130 may be composed of $Alq_3$ (tris(8-hydroxyquinoline) aluminium) for a green organic electroluminescent element and may be composed of DCJTB (4-(dicyanomethylene)-2-t-butyl-6-(1,1,7,7-tetramethyljulolidyl-9-enyl)-4H-pyran) for a red organic electroluminescent element. Also, for a blue organic electroluminescent element, the EML 130 may be composed of DPVBi (4,4'-bis(2,2-didphenylethen-1-yl)biphenyl).

When the EML 130 is composed of $Alq_3$, which is known as a light emitting material which also transports electron, it is not necessary to separately form the ETL 136. $Alq_3$ primarily transports electron, but can also transport hole. Thus, an $Alq_3$ layer may be formed as the EML 130, which also acts as an ETL, without separately forming the ETL 136 and an $Alq_3$ layer may be formed as the EML 130, which also acts as a HTL, without separately forming the HTL 134. The EIL 138 may be composed of LiF.

Figure 2:
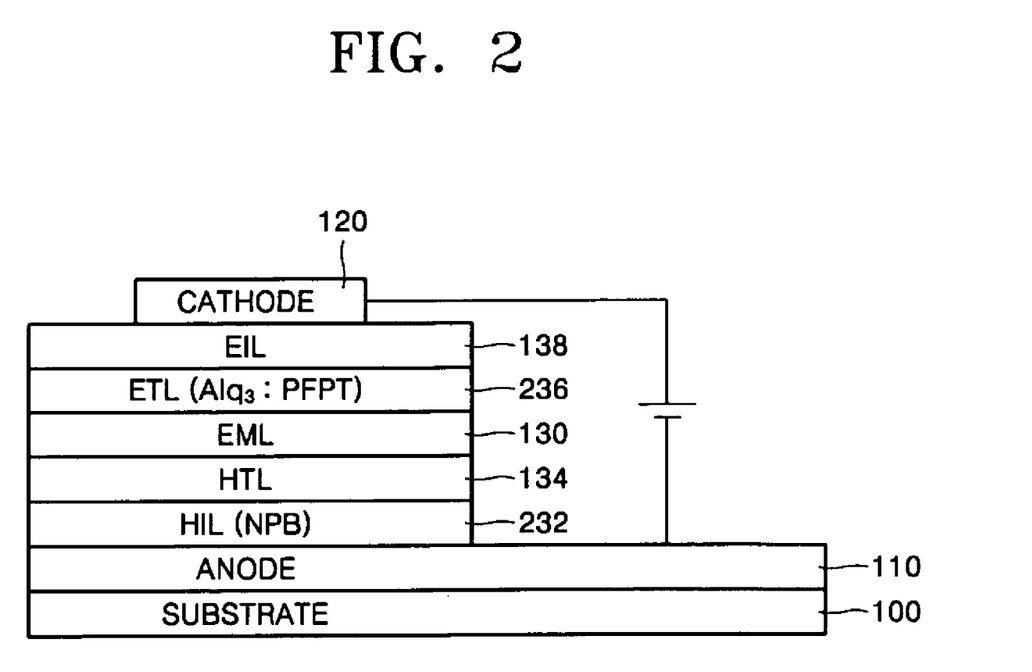
FIG. 2 is a schematic diagram of an organic electroluminescent element according to another embodiment of the present invention.

FIG. 2 is a schematic diagram of an organic electroluminescent element according to another embodiment of the present invention.

The organic electroluminescent element illustrated in FIG. 2 is similar to the organic electroluminescent element illustrated in FIG. 1, except that an $Alq_3$ layer doped with PFPT is formed as an ETL 236 and a HIL 232 is composed of NPB. Like reference numerals in the drawings denote like elements, and thus their description will be omitted. The concentration of PFPT doped in the ETL 236 may be 0.001 to 10% by weight.

Figure 3:
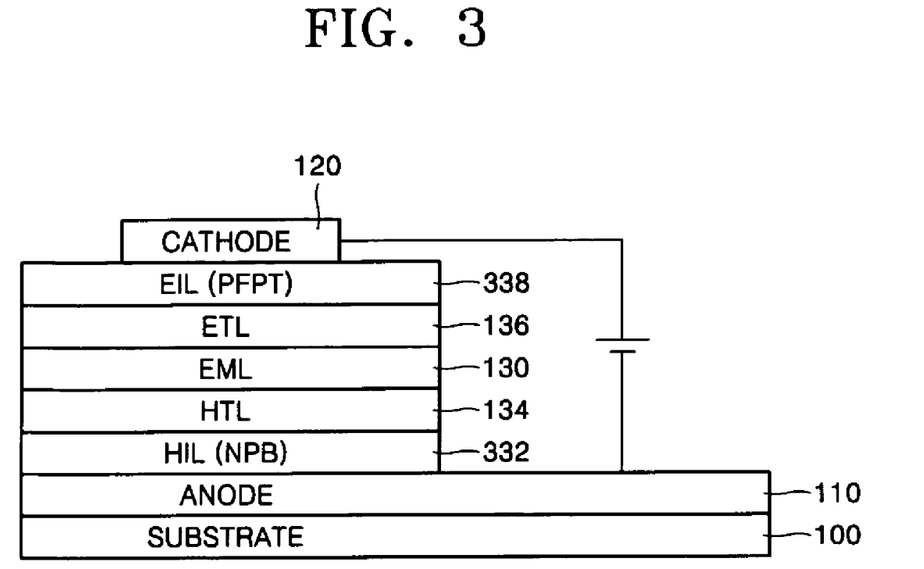
FIG. 3 is a schematic diagram of an organic electroluminescent element according to still another embodiment of the present invention.

FIG. 3 is a schematic diagram of an organic electroluminescent element according to still another embodiment of the present invention.

The organic electroluminescent element illustrated in FIG. 3 is similar to the organic electroluminescent element illustrated in FIG. 1, except that an EIL 338 is composed of PFPT and a HIL 332 is composed of NPB. Like reference numerals in the drawings denote like elements, and thus their description will be omitted. The PFPT layer as the EIL 338 may be formed, for example, by vacuum deposition, spin coating, inkjet coating, or screen printing.

In the present embodiment, one $Alq_3$ layer may act as both the EML 130 and the ETL136.

Figure 4:
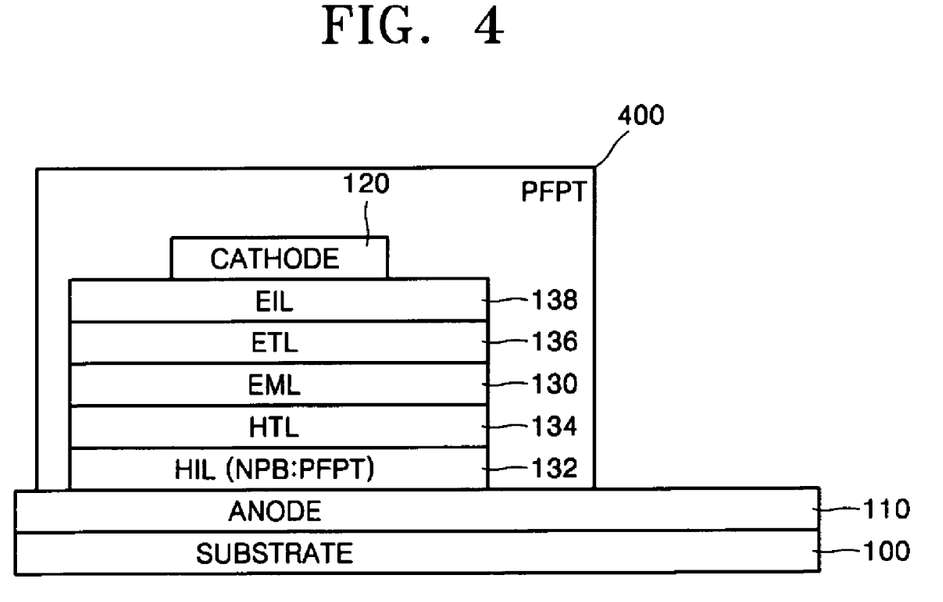
FIG. 4 is a schematic diagram of an organic electroluminescent element according to yet another embodiment of the present invention.

FIG. 4 is a schematic diagram of an organic electroluminescent element according to yet another embodiment of the present invention.

The organic electroluminescent element of the present embodiment has the same structure as that of the organic electroluminescent element of FIG. 1, except that a protecting layer 400 for protecting the two electrodes 110 and 120 and organic compound layers deposited between the two electrodes 110 and 120 from external moisture and oxygen is further included. The protecting layer 400 is composed of the triazine derivative compound represented by Formula (1). Like reference numerals in the drawings denote like elements, and thus their description will be omitted.

The present invention will now be described in greater detail with reference to the following examples. The following examples are for illustrative purposes only and are not intended to limit the scope of the invention.

EXAMPLE 1

Figure 5:
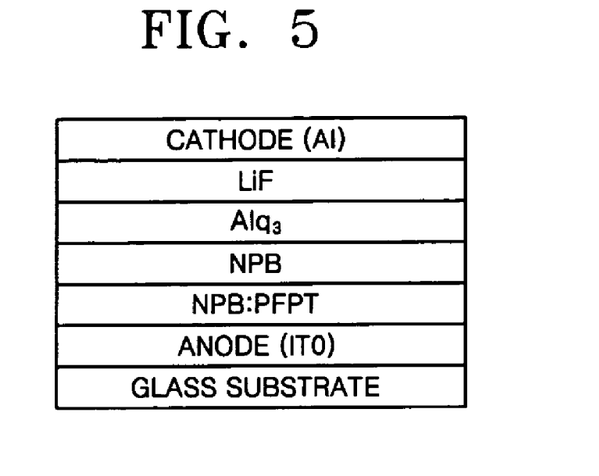
FIG. 5 is a schematic diagram of an organic electroluminescent element manufactured in Example 1 of the present invention.

To obtain the organic electroluminescent element illustrated in FIG. 1, an element having a layered structure illustrated in FIG. 5 was formed. The manufacturing process will be briefly described with reference to FIG. 5.

A transparent ITO electrode as an anode was deposited on a cleaned glass substrate, and then organic compound layers are sequentially deposited on the ITO electrode using a thermal depositing method with a vacuum deposition system under the pressure less than about $10^{-7}$-$10^{-6}$ Torr. For the purpose of this, NPB and PFPT were simultaneously supplied onto the substrate and deposited as a HIL. The thickness of NPB deposited was about 20 to 60 nm and the content of PFPT doped in NPB was about 0.1 to 10% by weight based on the total weight of NPB. NPB was used to form a HTL and $Alq_3$ was deposited as an EML and ETL to a thickness of about 50 to 100 nm. LiF was deposited as an EIL to a thickness of about 0.1 to 3 nm. Al was deposited as a cathode to a thickness of 50 to 150 nm.

While this example describes a specific embodiment, it will be understood by those skilled in the art that various changes in form and details may be made. For example, the substrate may also be composed of polycarbonate, polyimide, polyethyleneterephthalate or polyethylenenaphthalate. Also, the transparent electrode may be formed using indium oxide, tin oxide, zinc oxide or a mixture thereof.

EXAMPLE 2

Figure 6:
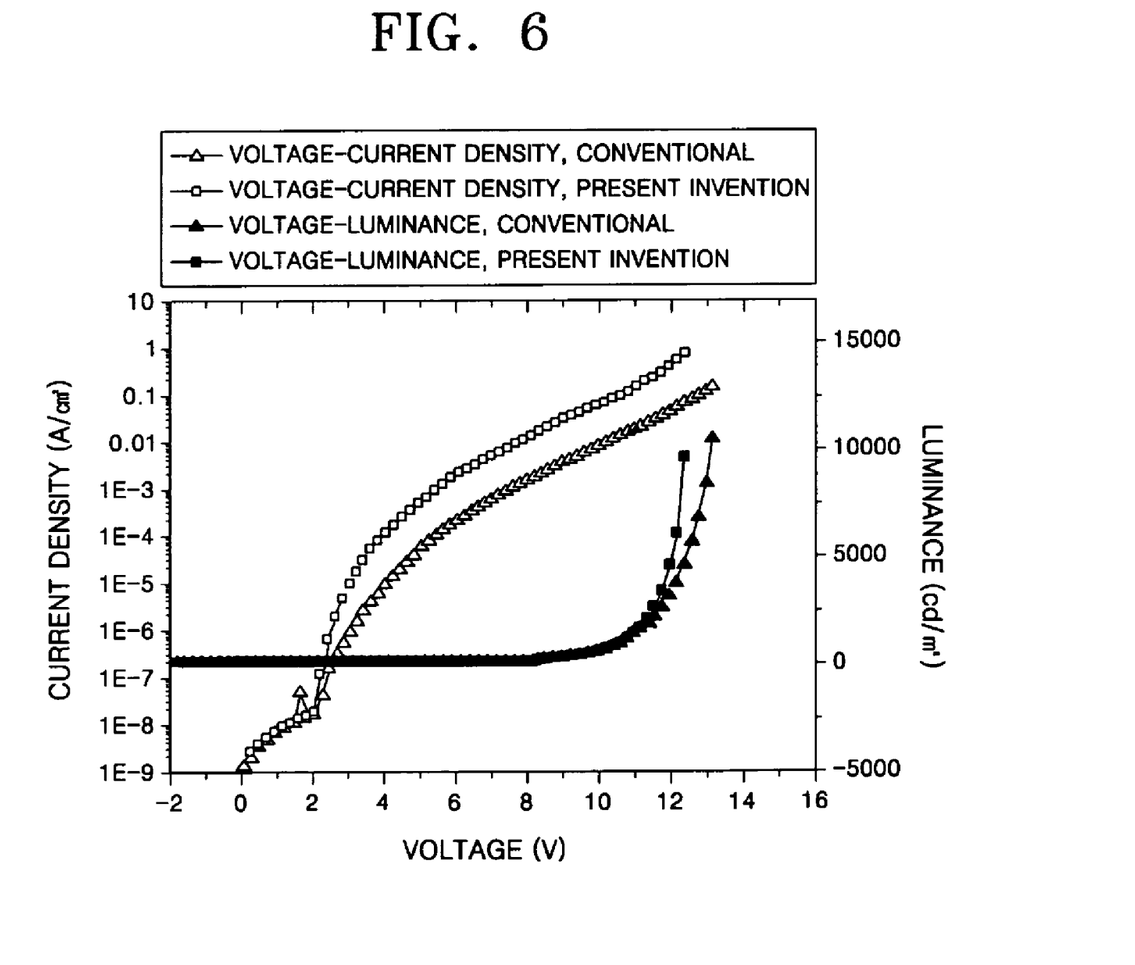
FIG. 6 is a graph illustrating voltage vs. current density and voltage vs. luminance of an organic electroluminescent element according to an embodiment of the present invention.
Figure 7:
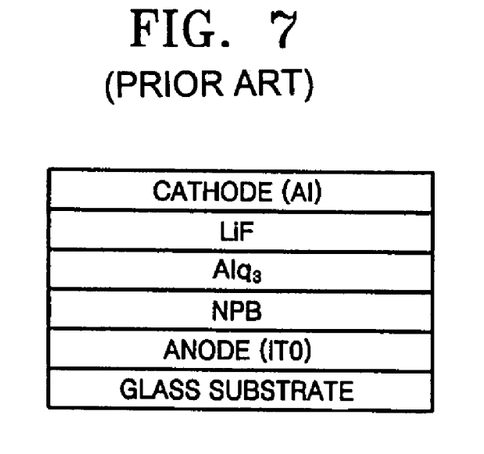
FIG. 7 is a schematic diagram of a conventional organic electroluminescent element evaluated for comparison in FIG. 6.

An EL spectrum for the organic electroluminescent element manufactured in Example 1 was evaluated and illustrated in FIG. 6. In FIG. 6, the EL properties, i.e., voltage vs. current density and voltage vs. luminance of the organic electroluminescent element manufactured in Example 1 of the present invention were compared with those of a conventional organic electroluminescent element. The organic electroluminescent element evaluated for comparison in the present Example is schematically illustrated in FIG. 7.

It can be seen from the results of FIG. 6 that the organic electroluminescent element according to an embodiment of the present invention has higher current density and luminance than the conventional organic electroluminescent element without changing turn-on voltage, indicating that there was no change in barrier to electron injection, but doping of NPB as the HTL with PFPT significantly increased electrical conductivity of holes compared to before doping. In addition, the PFPT material composed of C—F did not react with oxygen in air, which significantly increased the lifespan of the element.

EXAMPLE 3

Figure 8:
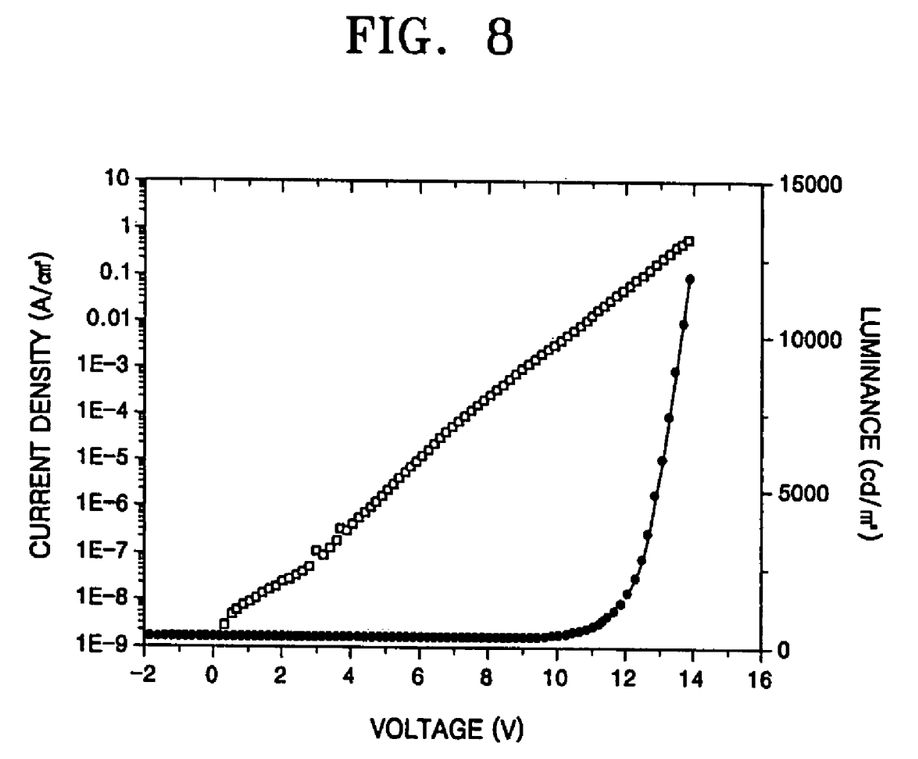
FIG. 8 is a graph illustrating voltage vs. current density and voltage vs. luminance of an organic electroluminescent element according to another embodiment of the present invention.
Figure 9:
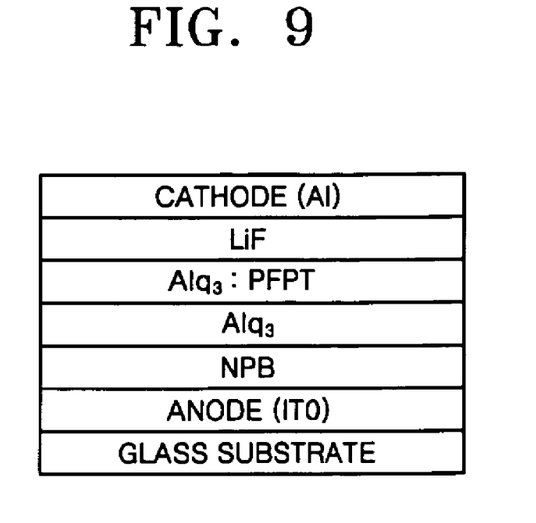
FIG. 9 is a schematic diagram of an organic electroluminescent element according to an embodiment of the present invention evaluated in FIG. 8.

FIG. 8 illustrates voltage vs. current density and voltage vs. luminance of the organic electroluminescent element in which PFPT was doped in an ETL as illustrated in FIG. 2. The organic electroluminescent element used in this evaluation is schematically illustrated in FIG. 9.

EXAMPLE 4

Figure 10:
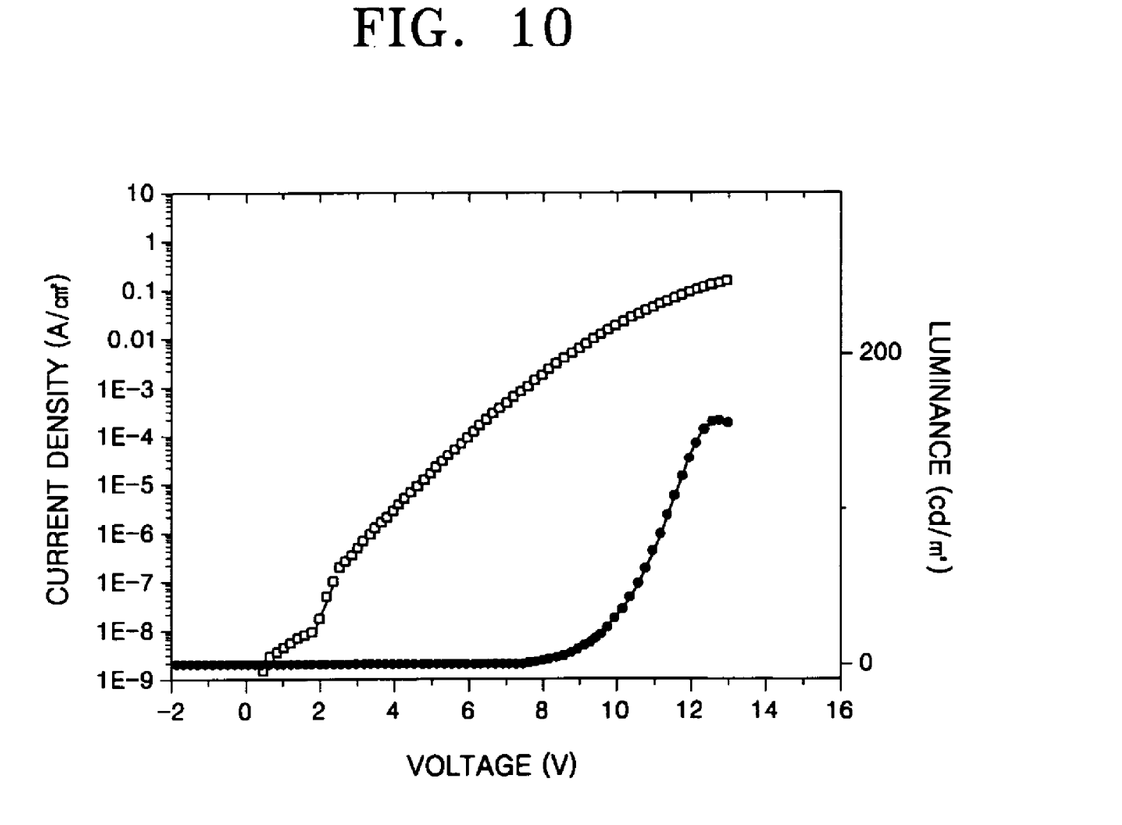
FIG. 10 is a graph illustrating voltage vs. current density and voltage vs. luminance of an organic electroluminescent element according to still another embodiment of the present invention.
Figure 11:
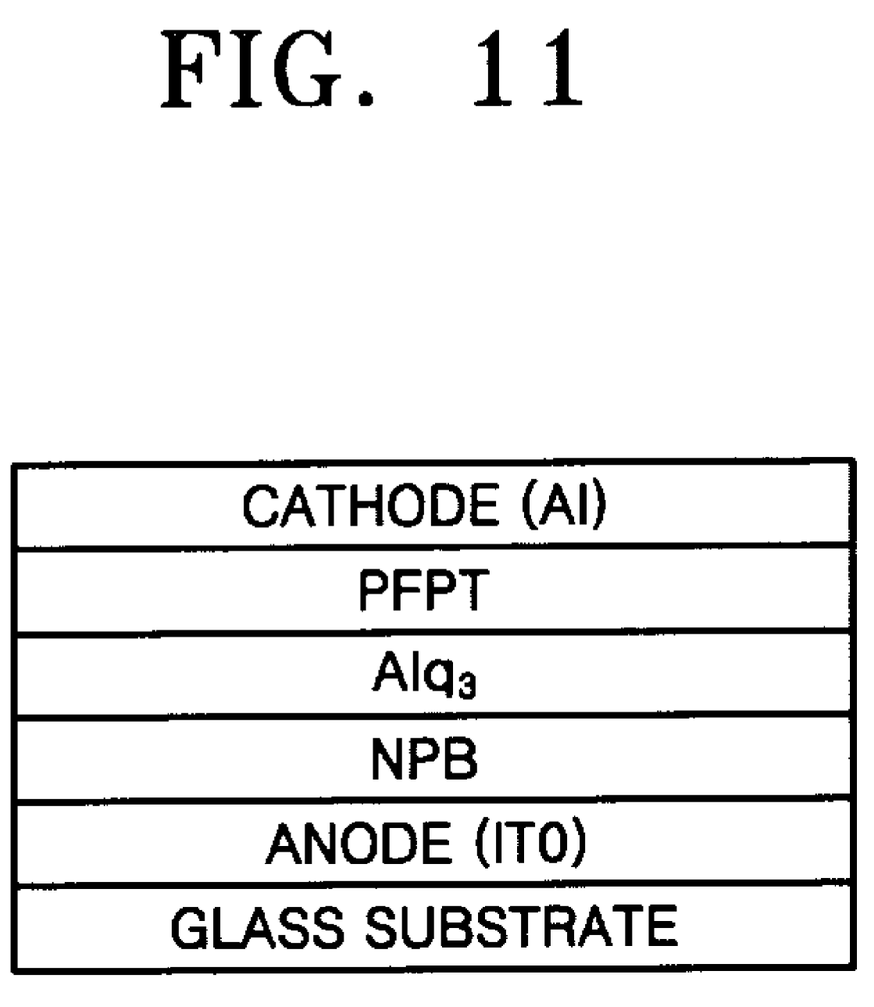
FIG. 11 is a schematic diagram of an organic electroluminescent element according to an embodiment of the present invention evaluated in FIG. 10.

FIG. 10 illustrates voltage vs. current density and voltage vs. luminance of the organic electroluminescent element in which an EIL was composed of PFPT as illustrated in FIG. 3. The organic electroluminescent element used in this evaluation is schematically illustrated in FIG. 11.

While organic electroluminescent elements including the triazine derivative compound having a C—F bond according to embodiments of the present invention were described, the present invention is not limited thereto. It will be understood by those skilled in the art that various layered structures and deposition methods may be applied in order to manufacture organic electroluminescent elements.

Organic electroluminescent elements according to embodiments of the present invention include an organic compound layer composed of a C—F compound (PFPT) having a triazine group rather than a benzene group, which is commonly known, as a central molecular group. The compounds according to embodiments of the present invention have lower energy levels (HOMO, LUMO) than any conventional n-type organic semiconductor material due to the triazine group having an electron-attracting property, and thus, can be used as a blocking layer in a HIL, a HTL, an EML, an ETL and an EIL according to the structure of an organic electroluminescent element and electrodes used. In particular, in the organic electroluminescent element, when PFPT is doped in the HTL to act as the HIL, high current density and luminance can be obtained. In addition, a protecting layer composed of PFPT can contribute to extend the lifespan of the organic electroluminescent element.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent element comprising:
   two electrodes; and
   at least one organic compound layer formed between the two electrodes,
   wherein the organic compound layer is composed of an organic compound doped with a triazine derivative compound represented by following Formula:

in which each of $R_1$, $R_2$ and $R_3$ is a perfluorophenylene derivative,
   wherein each of $R_1$, $R_2$ and $R_3$ is represented by the Formula:

where n is an integer from to 0 to 20.

2. The organic electroluminescent element of claim 1, wherein the concentration of the triazine derivative compound doped in the organic compound layer is 0.001 to 10% by weight.

3. The organic electroluminescent element of claim 1, wherein a hole injection layer, a hole transport layer, an emitting layer, an electron transport layer and an electron injection layer is sequentially deposited between the two electrodes and the organic compound is composed of at least one layer selected from the group consisting of the hole injection layer, the hole transport layer, the emitting layer, the electron transport layer and the electron injection layer.

4. The organic electroluminescent element of claim 1, wherein the organic compound layer is composed of NPB (N,N'-di(naphthalen-1-yl)-N, N'-diphenyl-benzidine) or TPD (N,N'-diphenyl-N,N'-bis(3-methylphenyl)-1,1'-bi-phenyl-4,4'-diamine) and the concentration of the triazine derivative compound doped in the organic compound layer is 0.001 to 10% by weight.

5. The organic electroluminescent element of claim 1, wherein the organic compound layer is composed of at least one compound selected from the group consisting of $Alq_3$ (tris(8-hydroxyquinoline) aluminium), DCJTB (4-(dicyanomethylene)-2-t-butyl-6-(1,1,7,7-tetramethyljulolidyl-9-enyl)-4H-pyran) and DPVBi (4,4'-bis(2,2-diphenylethen-1-yl)biphenyl) and the concentration of the triazine derivative compound doped in the organic compound layer is 0.001 to 10% by weight.

6. The organic electroluminescent element of claim 1, which further comprises a protecting layer for protecting the two electrodes and the organic compound layer from external moisture and oxygen, the protecting layer being composed of the triazine derivative compound.

7. An organic electroluminescent element comprising:
   two electrodes; and
   a hole injection layer, a hole transport layer, an emitting layer, an electron transport layer and an electron injection layer sequentially formed between the two electrodes,
   wherein at least one layer selected from the group consisting of the hole injection layer, a hole transport layer, an emitting layer, an electron transport layer and an electron injection layer is composed of a triazine derivative compound represented by the following Formula:

in which each of $R_1$, $R_2$ and $R_3$ is a perfluorophenylene derivative,
   wherein each of $R_1$, $R_2$ and $R_3$ is represented by the Formula:

where n is an integer from 0 to 20.

8. The organic electroluminescent element of claim 7, wherein the electron injection layer is composed of the triazine derivative compound.

9. An organic electroluminescent element comprising:
   two electrodes;
   a layered element including a hole injection layer, a hole transport layer, an emitting layer, an electron transport layer and an electron injection layer sequentially formed between the two electrodes; and
   a protecting layer for protecting the layered element from external moisture and oxygen,
   wherein the protecting layer is composed of a triazine derivative compound represented by the following Formula:

in which each of $R_1$, $R_2$ and $R_3$ is a perfluorophenylene derivative,
wherein each of $R_1$, $R_2$ and $R_3$ is represented by the Formula:

where n is an integer from 0 to 20.

* * * * *